United States Patent [19]

Griffis

[11] 4,387,413

[45] Jun. 7, 1983

[54] SEMICONDUCTOR APPARATUS WITH INTEGRAL HEAT SINK TAB

[75] Inventor: Patrick D. Griffis, Indianapolis, Ind.

[73] Assignee: RCA Corporation, New York, N.Y.

[21] Appl. No.: 220,127

[22] Filed: Dec. 24, 1980

[51] Int. Cl.³ .............................................. H05K 7/20
[52] U.S. Cl. .................................... 361/386; 361/405;
  357/81; 174/16 HS
[58] Field of Search ................... 165/80 B, 80 D, 185;
  174/16 HS, 52 FP; 357/81; 361/386–389, 395,
  399, 405, 417, 419

[56] References Cited

U.S. PATENT DOCUMENTS

| | | | |
|---|---|---|---|
| 3,259,814 | 7/1966 | Green | 357/81 |
| 3,519,889 | 7/1970 | Monaco | 174/16 HS |
| 3,665,256 | 5/1972 | Goun et al. | 317/100 |
| 4,038,678 | 7/1977 | Gottbreht | 174/16 HS |
| 4,054,901 | 10/1977 | Edwards | 357/81 |
| 4,068,289 | 1/1978 | Ferrigno | 174/16 HS |
| 4,254,447 | 3/1981 | Griffis | 174/16 HS |
| 4,270,138 | 5/1981 | Desmond | 174/16 HS |

OTHER PUBLICATIONS

TDA 2030, Linear Integrated Circuit, 5/1978.
RCA Linear Integrated Circuits, 11/1978, p. 480.
U.S. Application 210,838, Transistor Heat Sink Assembly, 11/26/80, Ramspacher et al.

*Primary Examiner*—G. P. Tolin
*Attorney, Agent, or Firm*—E. M. Whitacre; P. J. Rasmussen; Lawrence C. Edelman

[57] ABSTRACT

A semiconductor package is provided in which the semiconductor element is bonded to a slab of metal and is encapsulated in a body of insulating epoxy. Lead terminals are connected to the semiconductor element within the body and extend out from one end of the body. The metal slab extends out from the body from the same end as the lead terminals and in a plane which is parallel to that of the terminals, thereby forming a heat sink tab for the device. The package may be rigidly mounted on a printed circuit board by inserting the lead terminals and the heat sink tab into respective holes in a printed circuit board and soldering the terminals and tab to copper foil on the board. The solder connection of the heat sink tab to the copper foil provides an excellent thermal contact between the tab and the foil, in addition to providing a rigid support for the device.

1 Claim, 5 Drawing Figures

SEMICONDUCTOR APPARATUS WITH INTEGRAL HEAT SINK TAB

This invention relates to semiconductor devices and, in particular, to a semiconductor apparatus having an integral heat sink.

A well-known device package for power transistors and integrated circuits is the TO-220 package. In this package, the semiconductor element is bonded to a slab of metal and encapsulated in epoxy. The slab of metal forms a portion of the back surface of the encapsulation, and also extends upward from the encapsulation to form a heat sink tab. Leads are connected to the semiconductor element and extend out from the bottom of the encapsulation, in an opposite direction from the heat sink tab. Because the semiconductor element is bonded to the heat sink tab, reasonably low thermal resistances from the element to the heat sink tab are obtained.

The TO-220 semiconductor package may be mounted in a freestanding configuration on a printed circuit board, with the leads soldered in appropriately-spaced holes in the board. When mounted in this manner, however, the device is supported only by its relatively thin leads, and is subject to being bent over, which stresses the leads and may create an electrical short-circuit with nearby components on the board. Generally, however, the device is required to dissipate a relatively large amount of power, and a supplementary heat sink is needed in addition to the heat sink tab to aid in heat dissipation. The supplementary heat sink may be used to support the device and to conduct heat away from the device by attaching the device tab to the vertically-mounted heat sink with a screw.

In this arrangement, a thermal interface will exist between the device tab and the supplementary heat sink. The thermal conductivity between the device and the heat sink may be improved by applying a heat sink compound, such as silicon grease, between the two elements, but a significant thermal resistance will still be present at the interface. A better solution is to solder the device tab to the heat sink, but this is a more difficult procedure than simply bolting the device tab to the heat sink.

Accordingly, it is desirable to provide a package for a transistor or integrated circuit which can be easily mounted in a rigid freestanding position. It is also desirable for the package to be conveniently mounted with and soldered to a supplementary heat sink to provide improved thermal conductivity between the device and the heat sink.

In accordance with the principles of the present invention, a semiconductor package is provided in which the semiconductor element is bonded to a slab or metal and is encapsulated in a body of insulating epoxy. Lead terminals are connected to the semiconductor element within the body and extend out from one end of the body. The metal slab extends out from the body from the same end as the lead terminals and in a plane which is parallel to that of the terminals, thereby forming a heat sink tab for the device. The package may be rigidly mounted on a printed circuit board by inserting the lead terminals and the heat sink tab into respective holes in a printed circuit board and soldering the terminals and tab to copper foil on the board. The solder connection of the heat sink tab to the copper foil provides an excellent thermal contact between the tab and the foil, in addition to providing a rigid support for the device.

The device may also be used with a supplementary heat sink, which shares a common printed circuit board hole with the heat sink tab. The tab is easily soldered to the supplementary heat sink during wave soldering of the printed circuit board.

In an alternative embodiment of the present invention, the slab of metal extends outward from opposite ends of the epoxy body in a plane parallel to that of the lead terminals, thereby forming heat sink tabs on opposite ends of the device. The tabs may be bent to allow the device to be mounted in a printed circuit board at an oblique angle with respect to the board surface. When mounted in this manner, there is no need to bend the device lead terminals prior to mounting, which eliminates the stresses imparted to the terminals by bending, thereby improving the reliability of the device.

Figure 1:
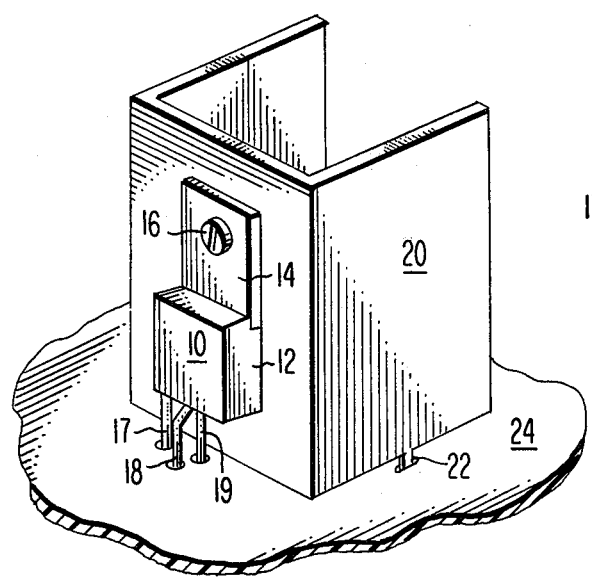
FIG. 1 illustrates a prior art assembly of a TO-220 transistor package and a supplementary heat sink mounted on a printed circuit board.

Referring to FIG. 1, a TO-220 package transistor 10 is shown mounted on a printed circuit board 24 with a supplementary heat sink 20. The transistor semiconductor element is enclosed in an epoxy body 12. The element is bonded to a metallic slab which extends upward from the body 12 to form a heat sink tab 14. Lead terminals 17, 18 and 19 are connected to the semiconductor element within the body 12 and extend downward from the body into holes in the printed circuit board 24. The transistor 10 is fastened to the supplemental heat sink 20 by a screw 16. A heat sink compound is generally spread over the surface of the tab 14 that is in contact with the heat sink to improve the thermal coupling between the transistor and the heat sink. The heat sink 20 includes tabs such as 22, which are inserted into holes in the printed circuit board 24. The supplemental heat sink 20 thus supports the transistor prior to soldering. The ends of the lead terminals 17, 18 and 19 and the tabs 22 are soldered to copper foil located on the lower surface of the printed circuit board 24 (not shown). The supplemental heat sink 20 therefore will securely support the transistor after soldering, preventing it from being accidently bent over.

Figure 2:
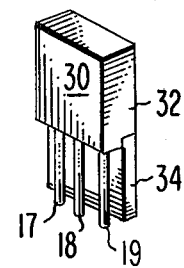
FIGS. 2 and 3 illustrate a semiconductor package constructed in accordance with the present invention.
Figure 3:
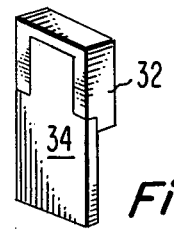

FIGS. 2 and 3 illustrate front and back perspective views of a semiconductor package 30 constructed in accordance with the principles of the present invention. Like the TO-220 package, the semiconductor element is encapsulated in an epoxy body 32, with connecting lead terminals 17, 18 and 19 extending from the bottom of the body. The semiconductor element is bonded to a metallic slab 34, which also extends from the bottom of the body 32 to form a heat sink tab, in a plane which is parallel to that of the lead terminals. The metallic slab covers most of the back side of the epoxy body, as shown in FIG. 3, so as to permit conduction of as much heat as possible from the semiconductor element.

The semiconductor package of FIGS. 2 and 3 can be mounted in a rigid, freestanding position on a printed circuit board when the use of a supplemental heat sink is not required. The ends of the lead terminals and the heat sink tab 34 are engaged in respective holes in the board, and are soldered to copper foil on the underside of the board. When soldered in place, the heat sink tab 34 will securely support the transistor and prevent it from being easily bent over. Since the heat sink tab 34 is solder bonded to the copper foil, the copper foil will also aid in dissipating heat from the device tab.

Figure 4:
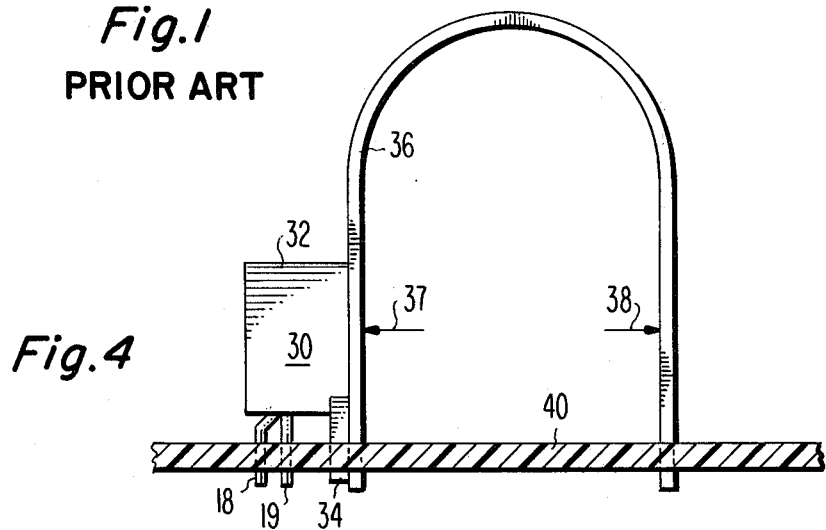
FIG. 4 illustrates a semiconductor package of the present invention mounted on a printed circuit board with a supplementary spring-clip type heat sink.

The semiconductor package of FIGS. 2 and 3 may advantageously be used with a spring-clip type supplemental heat sink of the kind described in my U.S. patent application Ser. No. 028,875, entitled, "INTEGRATED CIRCUIT HEAT DISSIPATOR", filed Apr. 10, 1979 now U.S. Pat. No. 4,254,447. Referring to FIG. 4, a side view of a spring-clip heat sink and a semiconductor package 30 mounted on a printed circuit board 40 is shown. Terminal leads 17, 18 and 19 and the heat sink tab 34 are inserted into respective holes in the printed circuit board 40. The spring-clip heat sink 36 is engaged in the board 40, with one end sharing the hole with the heat sink tab 34. The heat sink 36 is made of a resilient metal and tends to spring outward as indicated by arrows 37 and 38. The spring-clip heat sink 36 will thereby hold the semiconductor package 30 in place prior to soldering. After soldering, the end of the heat sink tab 34 is securely soldered to the adjoining end of the spring-clip heat sink 36, forming an excellent thermal bond between the tab and the heat sink.

Figure 5:
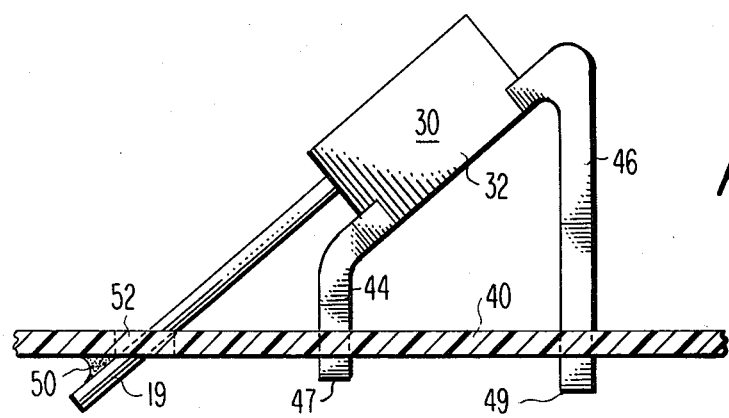
FIG. 5 illustrates an alternative embodiment of the present invention.

An alternate embodiment of the present invention is shown in FIG. 5. The semiconductor device 30 thereshown includes a metallic slab which extends out from the top and the bottom of the epoxy body 32. A section 44 of the slab extends downward from the lead end of the body 32, and corresponds to the heat sink tab 34 of FIGS. 2, 3 and 4. The other section 46 extends out from the opposite side of the body. The two heat sink tab sections are bent as shown in FIG. 5 to mount the device on a printed circuit board 40 without the need to bend the terminals 17, 18 and 19. This mounting technique is described in U.S. patent application Ser. No. 210,838, entitled, "TRANSISTOR HEAT SINK ASSEMBLY", filed Nov. 26, 1980, by R. J. Ramspacher, Jr. and C. E. West, now U.S. Pat. No. 4,344,106.

The device 30 is mounted on the printed circuit board 40 by first inserting terminal leads 17, 18 and 19 in a slot 52 in the board. The leads are separated in the slot 52 by projections of printed circuit board material as described in the Ramspacher, Jr. and West application. Once the terminals are inserted, the package is rotated toward the board surface to engage ends 47 and 49 of heat sink tabs 44 and 46 in slots in the printed circuit board. As the tab ends 47 and 49 are engaged, the terminals 17, 18 and 19 slide forward into the slot 52 and the package snaps into place, thus firmly holding the device in place on the board prior to soldering. When the package is soldered in place, a solder fillet 50 forms readily between each of the terminals and the copper foil on the underside of the printed circuit board.

When the semiconductor package 30 is mounted as shown in FIG. 5, there is no need to bend the leads prior to mounting, as is done in the FIG. 1 arrangement. Bending the leads creates stresses at the junction of the leads with the body 32, which can result in premature device failure. This is prevented in the embodiment of FIG. 5. In addition, the heat sink tabs 44 and 46 provide a snap fit for the package to hold it in place prior to soldering, and create an air flow cavity beneath the body 32 to further aid the heat dissipation process. Finally, the single unit construction of the semiconductor package with its mounting heat tabs 44 and 46 eliminates the previous assembly step in which a TO-220 package had to be initially bolted to a heat sink prior to mounting the assembly on a printed circuit board.

What is claimed is:

1. A thermally protected semiconductor package and printed circuit board mounting assembly comprising:
   a semiconductor element bonded to a first major surface of a slab of metal and encapsulated in epoxy so as to form a parallelepiped-shaped body for said semiconductor package which encloses said semiconductor element, the second major surface of which serves as a substantial portion of a first side of said body and extends outwardly from a second side of said body which is substantially perpendicular to said first side, said extended portion of said slab of metal serving as a heat sink tab for said element which is integral with said body, and a plurality of lead terminals connected to said semiconductor element within said body and also extending outwardly from said second side of said body;
   a printed circuit board having a plurality of lead holes which receive said lead terminals, a first hole, and a second hole located intermediate said lead and first holes which receives said integral heat sink tab; and
   a supplemental heat sink comprising a sheet of metal contoured at the center with a first end of said sheet inserted in said first hold and a second, opposite end of said sheet inserted in said second hole with a surface of the second end of said supplemental heat sink forcibly contacting said second major surface of said integral heat sink tab so as to urge said integral heat sink into contact with said printed circuit board in said second hole and thereby retain said supplemental heat sink and said semiconductor package on said printed circuit board.

* * * * *